(12) United States Patent
Mohd Arshad

(10) Patent No.: US 11,090,779 B2
(45) Date of Patent: Aug. 17, 2021

(54) METHOD AND TOOL TO IMPROVE EFFICIENCY AND EFFECTIVENESS OF WATERJET DE-BURR PROCESS

(71) Applicant: Texas Instruments Incorporated, Dallas, TX (US)

(72) Inventor: Mohamad Ashraf Mohd Arshad, Kuala Lumpur (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/442,316

(22) Filed: Jun. 14, 2019

(65) Prior Publication Data

US 2020/0391349 A1    Dec. 17, 2020

(51) Int. Cl.

| | |
|---|---|
| *B24C 5/04* | (2006.01) |
| *H01L 21/78* | (2006.01) |
| *H01L 21/48* | (2006.01) |
| *H01L 23/00* | (2006.01) |
| *B24C 1/00* | (2006.01) |

(52) U.S. Cl.
CPC .............. *B24C 5/04* (2013.01); *B24C 1/006* (2013.01); *H01L 21/4842* (2013.01); *H01L 21/78* (2013.01); *H01L 24/96* (2013.01)

(58) Field of Classification Search
None
See application file for complete search history.

(56) References Cited

U.S. PATENT DOCUMENTS

| | | | | |
|---|---|---|---|---|
| 6,960,119 | B1* | 11/2005 | Said | B24C 1/003 451/39 |
| 10,083,866 | B2* | 9/2018 | Bin Mohd Arshad | H01L 21/4842 |
| 10,879,121 | B2* | 12/2020 | Bin Mohd Arshad | H01L 23/49548 |
| 2004/0097171 | A1* | 5/2004 | Liwszyc | B24C 5/04 451/36 |
| 2005/0133641 | A1* | 6/2005 | Chung | B05B 15/40 239/596 |
| 2018/0033647 | A1* | 2/2018 | Bin Mohd Arshad | H01L 23/49548 |
| 2019/0035685 | A1* | 1/2019 | Bin Mohd Arshad | H01L 21/565 |
| 2021/0074587 | A1* | 3/2021 | Bin Mohd Arshad | H01L 21/561 |

* cited by examiner

*Primary Examiner* — Zandra V Smith
*Assistant Examiner* — Lawrence C Tynes, Jr.
(74) *Attorney, Agent, or Firm* — Dawn Jos; Charles A. Brill; Frank D. Cimino

(57) ABSTRACT

A waterjet nozzle is provided for deflashing a leadless package device. The waterjet nozzle has a central core having a conically shaped passage between a nozzle inlet, lying in a first plane, and a nozzle outlet, lying in a second plane. The nozzle includes a groove, in the waterjet nozzle, above a third plane defining an end of the waterjet nozzle, along a first line in the third plane. A tube connects the nozzle outlet to the groove. The nozzle includes a flange, lying below the third plane along a second line, in the third plane, intersecting the first line. The waterjet nozzle may be used to deflash a leadframe package by inserting the flange from a waterjet nozzle into a singulation cut on a lead frame; and injecting a waterjet through the conically-shaped passage from the nozzle inlet through the nozzle outlet.

15 Claims, 8 Drawing Sheets

FORCE FROM INWARD OUT

METHOD AND TOOL TO IMPROVE EFFICIENCY AND EFFECTIVENESS OF WATERJET DE-BURR PROCESS

BACKGROUND

A variety of semiconductor chip packages provide support for a semiconductor die (e.g., integrated circuit (IC) chip) and associated bond wires. These packages provide protection from the environment and enable surface mounting of the die to a printed circuit board (PCB), typically with solder joints. For purposes of high-volume, low-cost production of chip packages, an etch or stamp of a thin sheet of metal material is used to form a panel or strip which defines multiple leadframes. A single strip may be formed to include multiple 2D arrays, with each such array including a plurality of leadframes in a particular pattern. In a chip package manufacturing process, the integrated circuit (IC) dies (die) are mounted and then wire bonded to respective ones of leadframes. Thereafter, an encapsulant material (or mold compound) is applied to the strip so as to encapsulate the IC dies (die), bond wires, and portions of each of the leadframes.

Upon the hardening of the encapsulant material, the leadframes within the strip are cut apart or singulated for producing individual chip packages. Such singulation may be accomplished via a sawing process. In such a saw process, a saw blade (or dicing blade) is advanced along "saw streets" which extend in prescribed patterns between the leadframes to separate the leadframes from one another.

During fabrication of small Outline Integrated Circuit (SOIC) and dual-in-line (DIP) packages, the solder joints of leadless packages, such as Quad Flat No-Lead (QFN) packages or Small Outline No-Lead (SON) packages, in connection with singulation, often lead to burrs, such as copper (Cu) burrs. Cu burr protrusions can be observed after a waterjet process to optimize the elimination of Cu burr protrusions. The waterjet optimization includes shifting the jetting position farther away from the package edge FIG. 1A illustrates a top plan view of sawn leads 5, each represent as CU burr protrusions 5 disposed along partial cut line 115 representing a partial singulation cut of molded leadframe 20.

FIG. 1B illustrates a cross-sectional view of leadframe 20 having recess 10, which is beneficial in the surface mount process, alongside partial cut line 115. Water injector 125 dispenses waterjet 26 to remove Cu burrs 5 from recess 10. The placement of water injector 25 near an inner edge of recess 10 may effectively break the join between Cu burr 5 and leadframe 20 in most cases, sweeping burr 5 out along the direction indicated by path 28. However, when burr size increases due with process variation, Cu burr flips over and into positions on the leadframe resulting in Cu protrusion 6.

A need exists for a tool and method to solve the foregoing problem of Cu burr protrusion by causing a Cu burr to be pushed away from a singulation cut line.

SUMMARY

A waterjet nozzle is provided for deflashing a leadless package device. The waterjet nozzle has a central core having a conically shaped passage between a nozzle inlet, lying in a first plane, and a nozzle outlet, lying in a second plane. The nozzle includes a groove, in the waterjet nozzle, above a third plane defining an end of the waterjet nozzle, along a first line in the third plane.

A tube connects the nozzle outlet to the groove. The waterjet includes a flange, which lies below the third plane, along a second line, in the third plane, intersecting the first line.

The waterjet nozzle may be used to deflash a leadframe package by inserting the flange from a waterjet nozzle into a singulation cut on a lead frame; and injecting a waterjet through the conically-shaped passage from the nozzle inlet through the nozzle outlet.

BRIEF DESCRIPTION OF THE DRAWINGS

For a more complete understanding of the present disclosure, the objects and advantages thereof, reference is now made to the ensuing descriptions taken in connection with the accompanying drawings briefly described as follows.

Reference will now be made to the accompanying drawings, which are not necessarily drawn to scale, wherein:

FIG. 2B illustrates a cross-sectional view of a leadframe, having recess, pursuant to a surface mount process, alongside a cut line wherein nozzle water flow is directed from outward in.

DETAILED DESCRIPTION

Figure 1A:
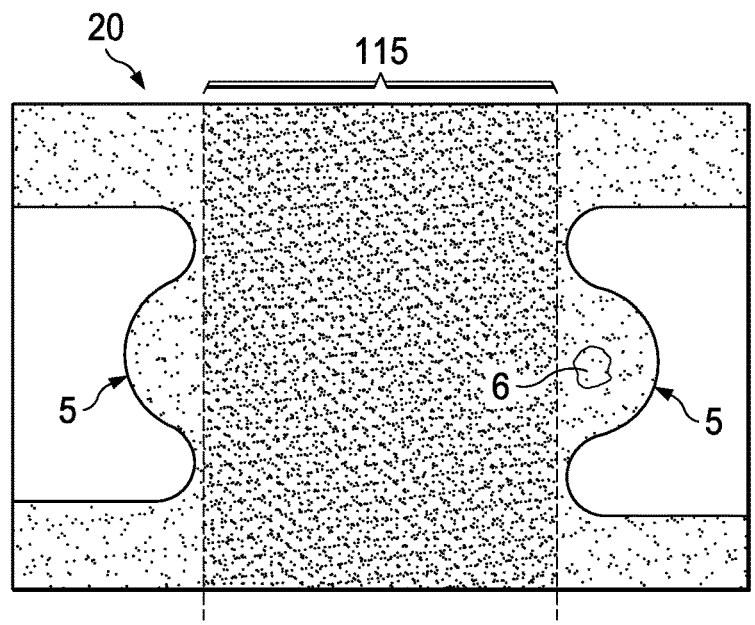
FIG. 1A illustrates a top plan view of two copper (CU) sawn leads, one shown with a CU burr protrusion disposed along a cut line representing a partial singulation cut on a molded leadframe.
Figure 1B:
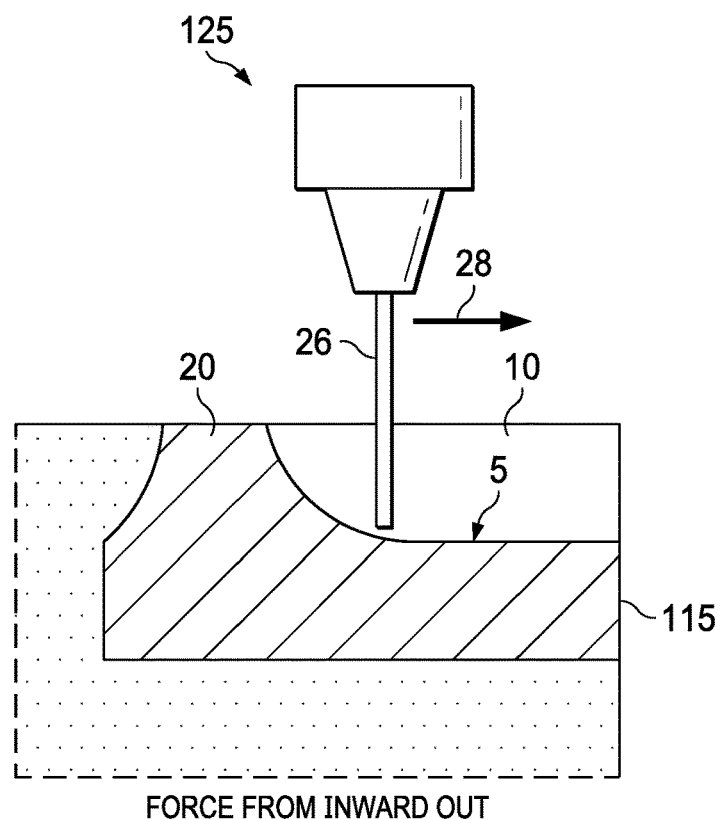
FIG. 1B illustrates a cross-sectional view of a leadframe having a recess, pursuant to a surface mount process, alongside a cut line wherein nozzle water flow is directed from inward out.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 1C:
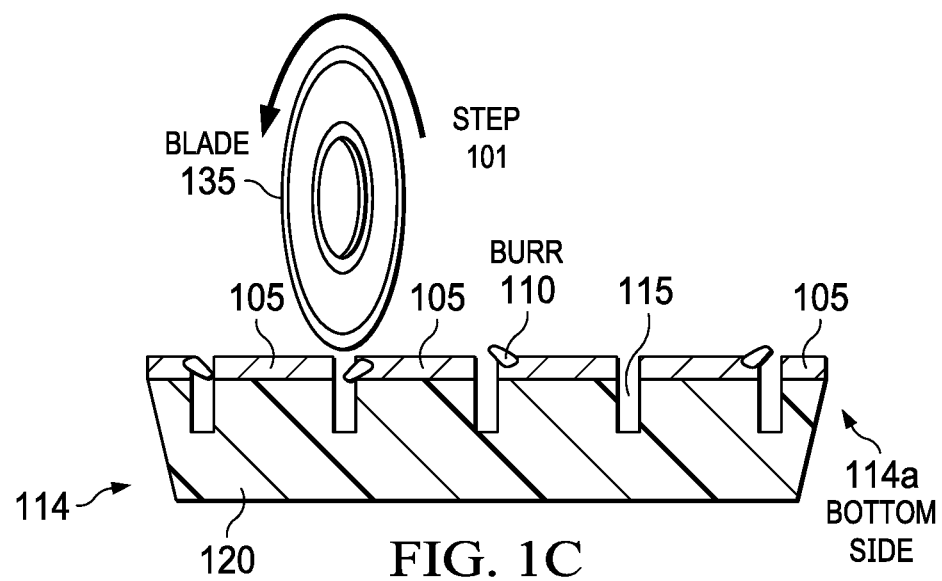
FIG. 1C illustrates a section view of which depicts a first part of a 2-cut method of sawing for singulation of a leadless packaged semiconductor device.

FIG. 1C depicts a first part of an exemplary 2-cut method of forming a leadless packaged semiconductor device that solves the problem of removing burrs from leads and not reintroducing the burrs during subsequent processing, according to an example. FIG. 1C shows a saw blade (dicing blade) 135 on the lead side (bottom side) 114a of the in-process package 114 with the results of the first partial sawing(s) (first sawing(s)) shown as partial cuts 115 or "saw lanes" extending completely severing (through the thickness of) the conductive layer 105 identified in FIG. 1C. The sawing(s) ate made through only a portion of the thickness of the mold compound 120, shown as an example of being about ½ (50%) of the thickness of the mold compound 120. The first cut process is noted as step 101 on FIG. 1C. The leadframe may comprise copper or copper alloy and optionally include a plating layer.

Generally, the partial cuts 115 into the package from the first cut is shallower compared to the second cut. The in-process package units being processed are generally in strip (or panel) form for ease of handling. Burrs resulting from the first sawing, shown as burrs 110, are shown included within the partial cuts 115. For leads having corner recesses for implementing a wettable flank lead design, the burrs have a strong tendency to enter the recesses. These burrs protrude into the partial cuts 115 and may be referred to as burr protrusions.

Figure 1D:
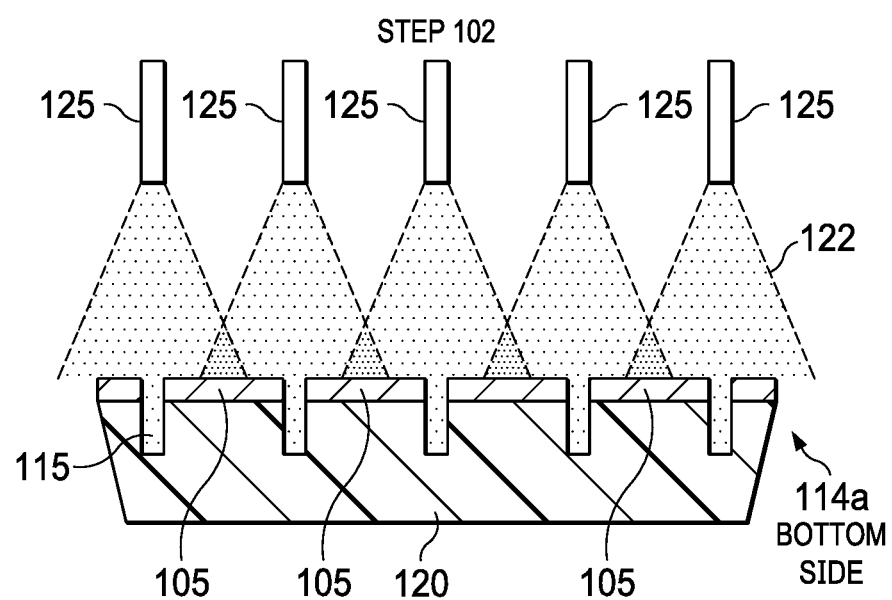
FIG. 1D illustrates a cross-sectional view of high-pressure water treatment as the part of a de-flash process applied to a packaged semiconductor device.

FIG. 1D depicts an example high-pressure water treatment with water 122 shown dispensed from the nozzles of water injectors 125 as the de-flash process applied to the bottom side 114a of the package shown. The depiction is at the end of the de-flashing, which removes burrs 110 that are shown in FIG. 1C. A burr, which is also referred to as a "flash," is residue material left behind in connection with a manufacturing packaging process step. Deflashing or deburring is act of removing flash/burr material from the package. This de-flashing is noted as step 102. For example, for the high-pressure water treatment, a pressure range of 500 to 900 kg/cm.$^2$ may be used. The in-process package units for this de-flash process generally continue to be in strip (or panel) form for ease of handling. Other de-flash processing can include cryogenic-based and laser-based processing. A de-flash cure may follow the de-flash process.

In order to solve the foregoing problems resulting from Cu burr and Cu burr protrusions, it is desirable to sweep the Cu burrs away from the singulation cut line. This may be accomplished through modification of a high-pressure nozzle, which integrates a flange along the span of the nozzle face.

Figure 2A:
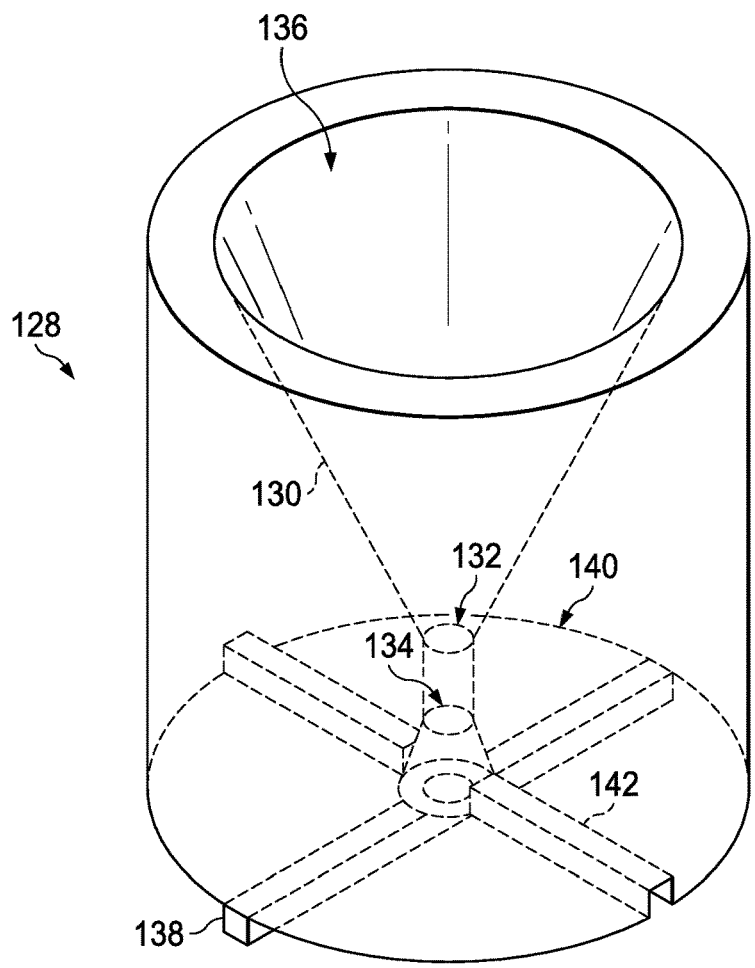
FIG. 2A illustrates a perspective drawing of a cylindrically-shaped nozzle located at the end of each injector.
Figure 2B:
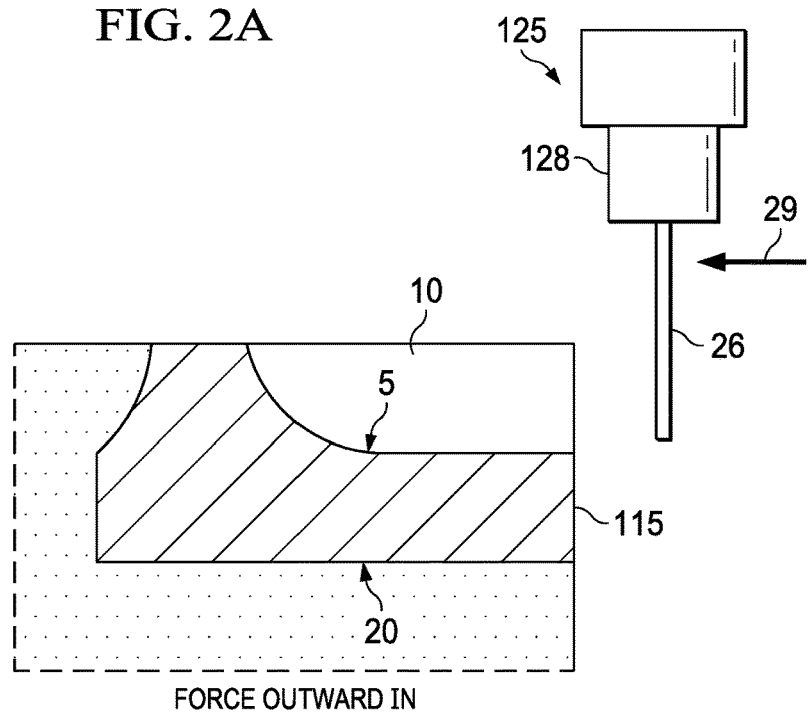

FIG. 2A illustrates a perspective drawing of a cylindrically-shaped nozzle 128 located at the end of each injector 125. High-pressure water may flow through nozzle 128. Nozzle 128 includes a centrally-located conical section 130 tapering toward nozzle outlet 132. Nozzle outlet 132 is connected to groove 142 through tube 134, which provides a passage through which water may flow from nozzle outlet 132 into grove 142 located above end 140 of nozzle 128. High-pressure water (from a water source providing pressurized water, not shown) may enter nozzle 128 from nozzle inlet 136. Nozzle 128 includes flange 138, located on end 140 (on an opposite side from groove 142) of nozzle 128, which may be positioned to fit within partial cut 115. Flange 138 serves to increase water flow resistance. High-pressure water flow from nozzle 128 will take path of least resistance creating an "outward in" flow in the direction of path 29 as shown in FIG. 2B. In some examples, water may be sent through nozzle 128 on a pulsed basis to facilitate removal of burrs and particles. The pulses may create bursts of a waterjet through the nozzle. Additionally, in some examples, in order to better facilitate burr or particle removal, the pulsed water may be applied with varying amounts of pressure. This includes water pressure which gradually increases, in some examples, and water pressure which gradually decreases in other examples.

FIG. 2B illustrates a cross-sectional view of leadframe 20 having recess alongside partial cut line 115 wherein water injector 125 dispenses waterjet 26 near partial cut line 115 to result in water flushing a CU burr in the direction shown by arrow 29.

Figure 2C:
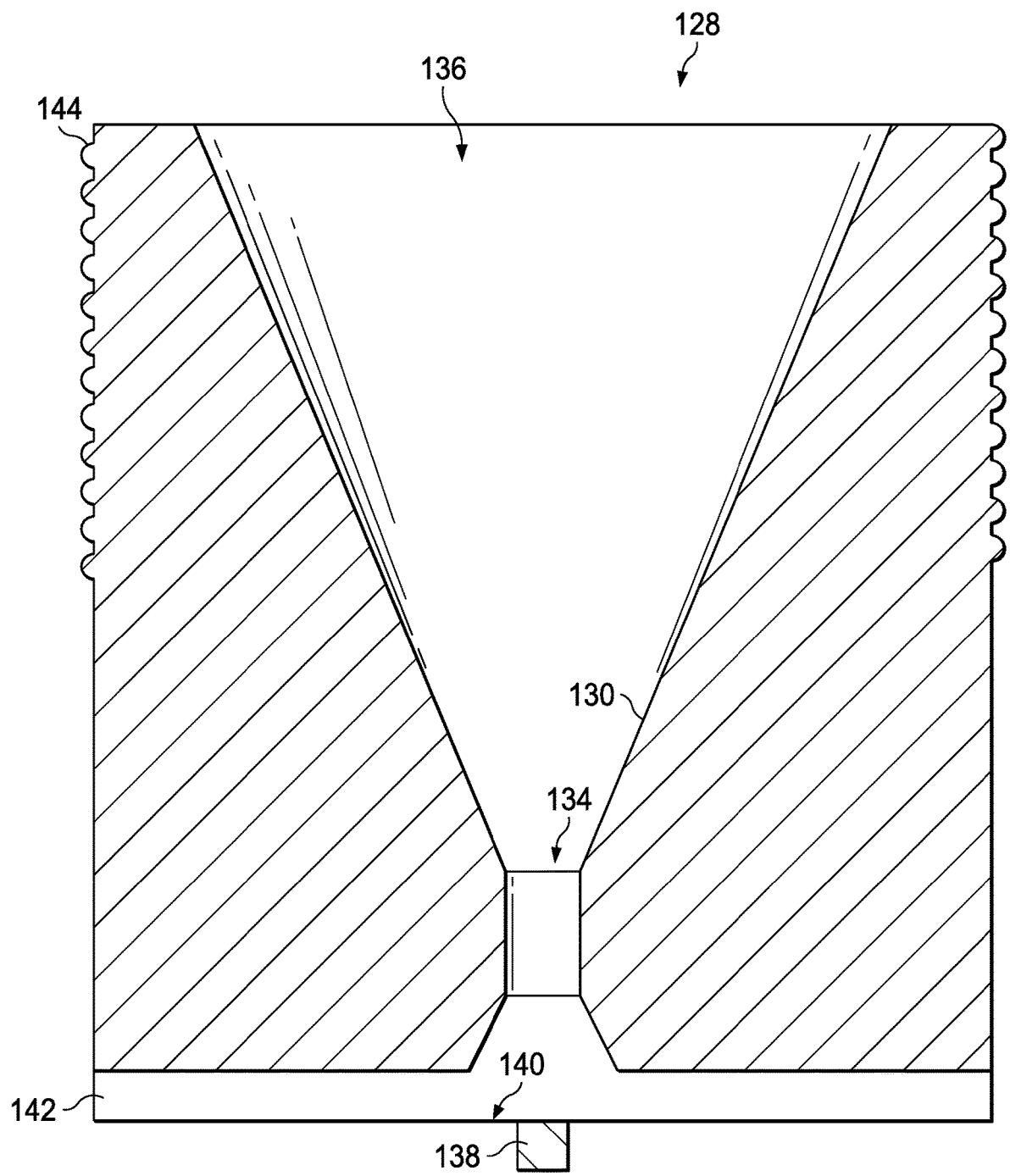
FIG. 2C illustrates a cross-sectional view of a nozzle further illustrating the position of a flange relative to a groove.

FIG. 2C illustrates a cross-sectional view of nozzle 128 further illustrating the position of flange 138 relative to groove 142.

Figure 2D:
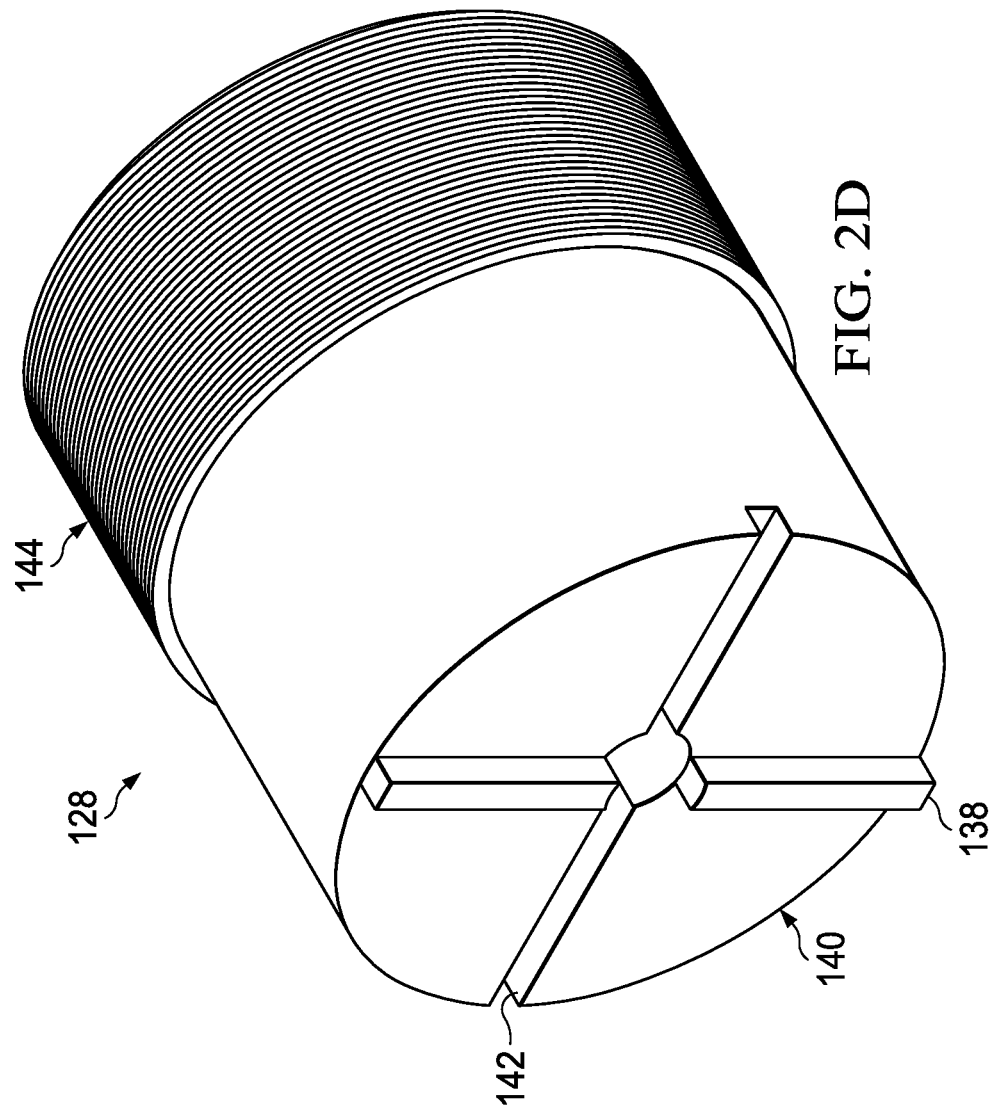
FIG. 2D illustrates perspective drawing showing a bottom of a nozzle, which also includes a grove, which lies parallel to a flange on the nozzle.

FIG. 2D illustrates a perspective drawing showing a bottom of nozzle 128, which also includes grove 142, which receives water from an outlet (not shown), which lies perpendicular to flange 138 on end 140. FIG. 2D also shows threads 144, which may line the outside of nozzle 128. Threads 144 may engage corresponding threads (not shown) within a water injector (not shown) for attachment of nozzle 128 on to the end of water injector 125 as shown in FIG. 2B.

Figure 2E:
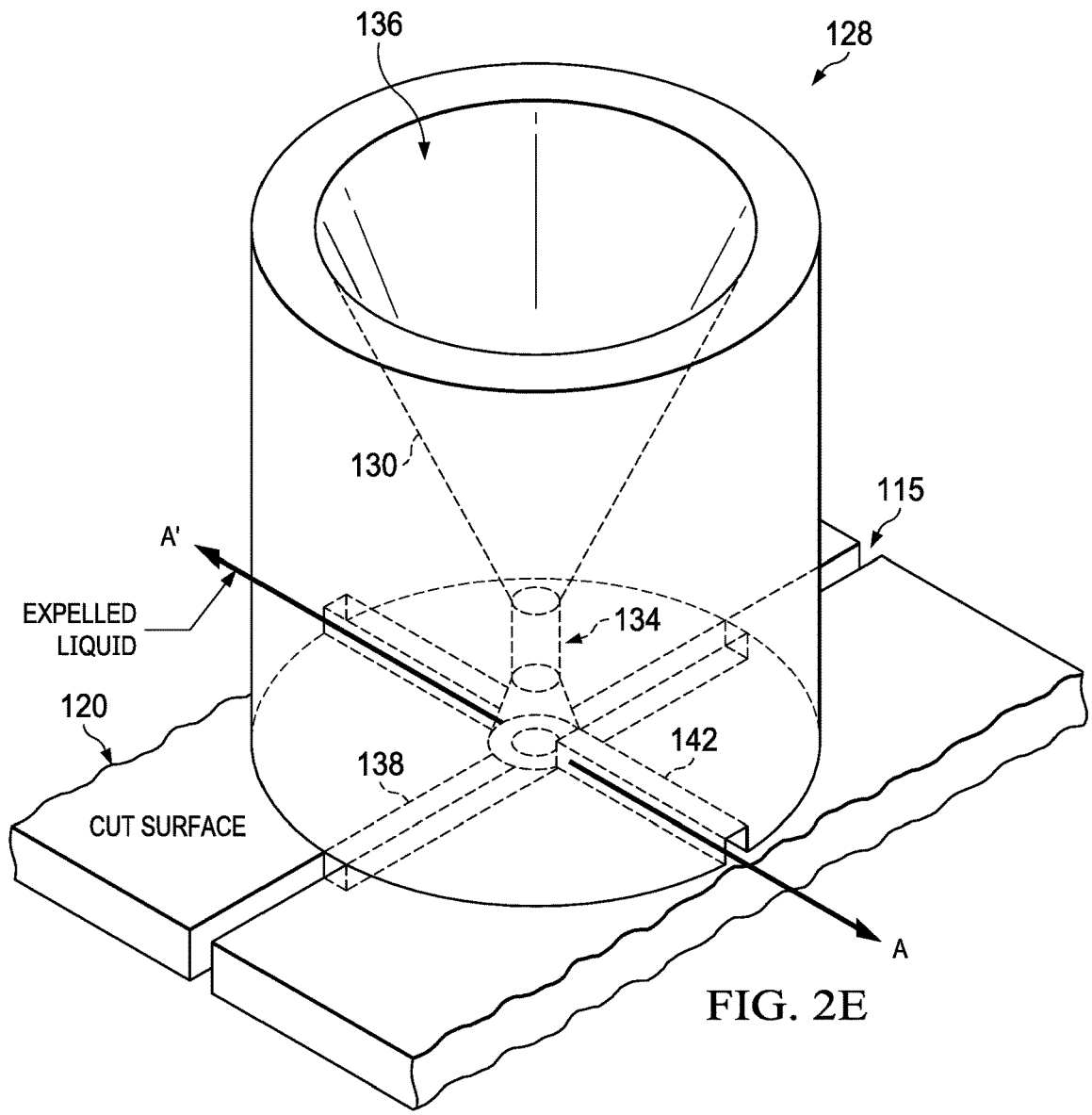
FIG. 2E illustrates a perspective drawing of a nozzle with a flange positioned within a partial cut.

FIG. 2E illustrates a perspective drawing of nozzle 128 with flange 138 positioned within partial cut 115 in mold compound 120. Water from nozzle 128, during de-flashing, is expelled away from flange 138 within groove 142 along line A-A'.

Figure 3:
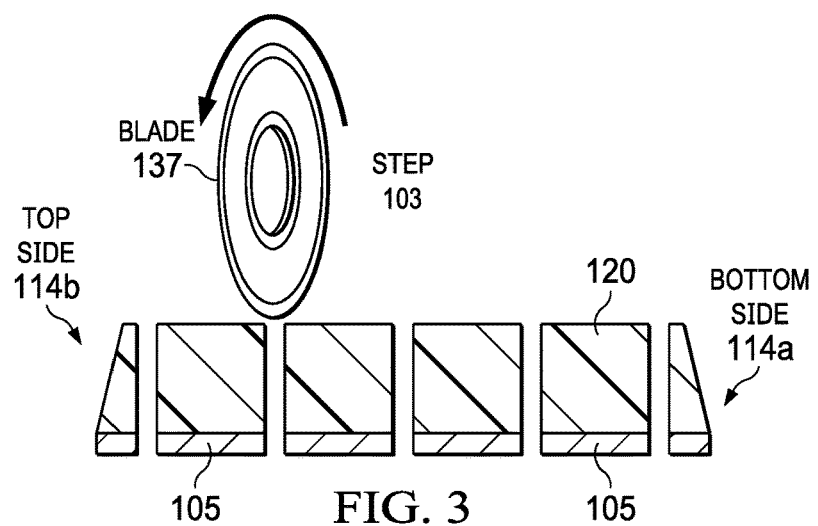
FIG. 3 illustrates a section view of the second part of the example 2-cut method of sawing for singulation for a leadless packaged semiconductor device, according to an example embodiment.

FIG. 3 illustrates the second part of the exemplary 2-cut method of forming a leadless packaged semiconductor device. The package portion after the second sawing (after the de-flash process) from the top side 114b of the package is aligned to the partial cuts 115. The second sawing provides a cut to complete the partial cut 115 in the mold compound 120 from the top side 114b to singulate the package from the strip (or panel) without touching the pre-cut leads. The second sawing process is noted as step 103. Avoiding saw blade contact with the pre-cut leads avoids re-introducing burrs on the leads after being cleaning by de-flash processing.

With reference to FIG. 3, alignment for second sawing can be provided by guidance by the lines of the partial cuts 115. Blade 137 for the second cut process is thus aligned to the partial cuts 115. Blade 137 may be the same size as blade 135 used for the first sawing, or wider to provide a wider cut as compared to the first sawing. For example, the cut from the second sawing can be ≥0.0.025 mm wider as compared to the width of the partial cut lines 115 from the first partial sawing, with a width range of partial cuts 115 being 0.15 to 0.30 mm, and the width range of the second cuts being 0.20 mm to 0.35 mm. In another embodiment the second sawing can provide cuts ≥0.05 mm wider as compared to the width of the partial cuts 115.

Advantages of the forgoing 2-cut methods of forming a leadless packaged semiconductor device include no need for new equipment, facility investment or change in lead-frame designs. The foregoing 2-cut methods are implementable with standard lead-frame designs. It is also possibly to extend disclosed methods to saw thicker packages. For aligning the first cut to the second cut, two example alignment methods are described.

Figure 4A:
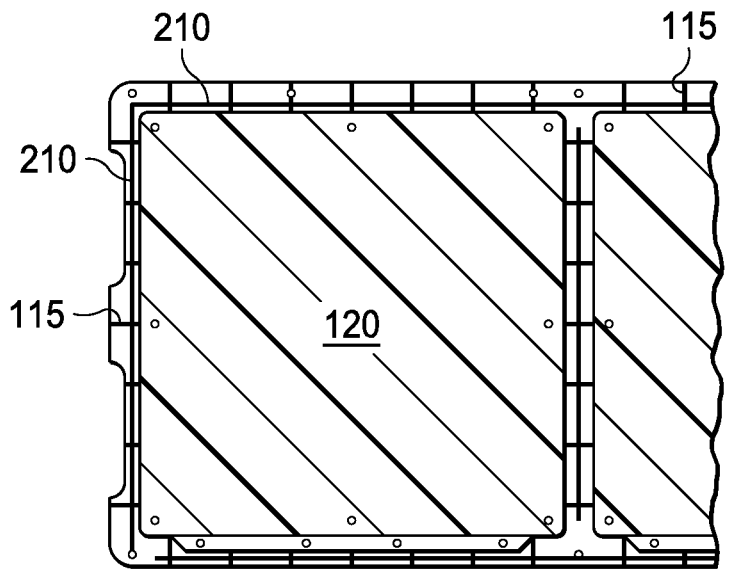
FIG. 4A and FIG. 4B show bottom side perspective depictions of a portion of a leadframe strip of example structures for aligning the second (top side) cut to the first (bottom side, lead side) cut, according to an example embodiment.

FIG. 4A is a bottom side perspective depiction of a portion of a leadframe strip having partially assembled QFN devices with alignment features implementing a first example alignment option.

The partial cuts 115 created by the first cut process (step 101) are used as an alignment reference, which ensures the second cut error tolerance is minimized Here "dummy" cuts 210 (solely for alignment) on the leadframe each form an alignment mark (fiducial mark), which is consistent so that the second cut (step 103) will be aligned to partial cuts 115. When the first partial cut is offset, then the second cut will be aligned to this offset cut. The "dummy" cuts 210 can be performed either from top side or bottom side of the leadframe.

Dummy cuts 210 are generally made during forming the partial cuts 115 and thus will generally be the same dimensions as partial cuts 115.

Figure 4B:
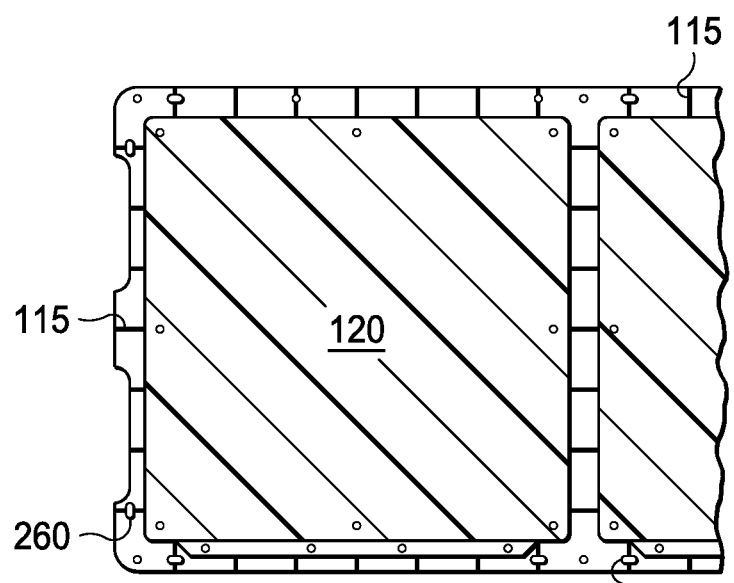

FIG. 4B, illustrates a bottom perspective depiction of a portion of a leadframe strip having partially assembled QFN devices, having alignment features 260 intercepting the partial cut lines 115, forming an align mark intercepting some of the cut lines 115. This second example alignment method comprises using the first cut line as a main reference for the second cut alignment. It has been found that fiducial marks using the same saw machine increase the alignment target score (a measure of the alignment accuracy) compared to only using partial cut line(s). This reduces the alignment fail error frequency on the saw machine. The leadframe may also include features intercepting the first saw line to form an align mark as described above.

Figure 5:
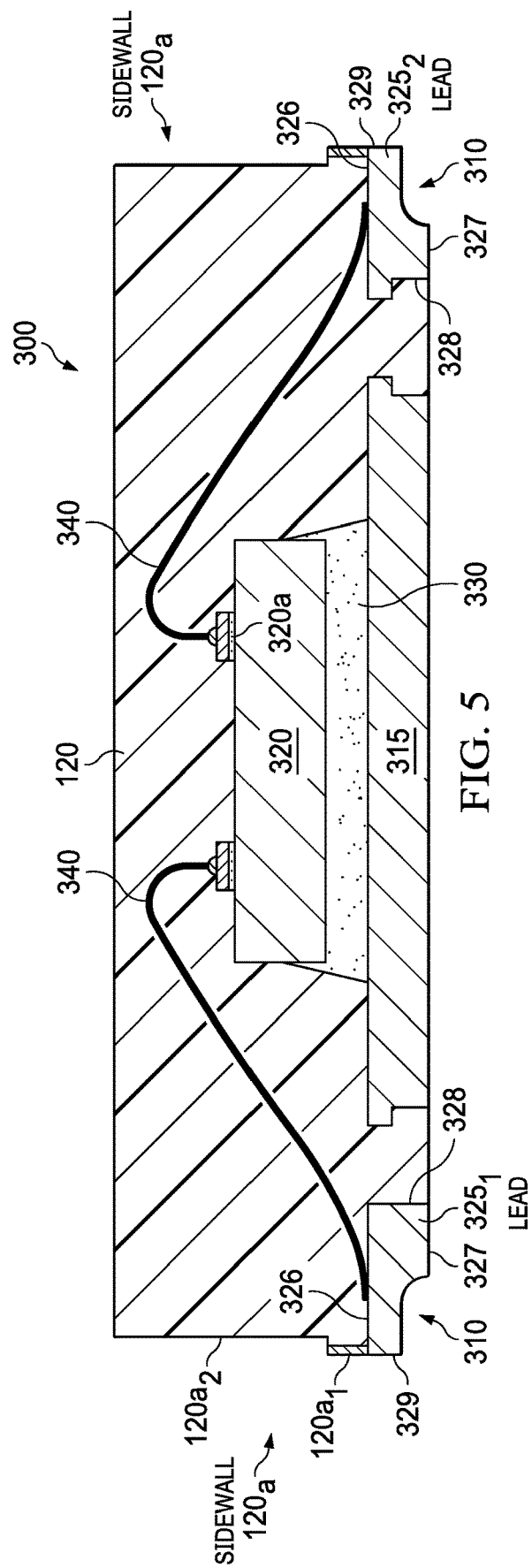
FIG. 5 is a cross sectional depiction of an example leadless packaged semiconductor device having a wettable flank lead design provided by a recess at the bottom corner region, according to an example embodiment.

FIG. 5 is a cross sectional depiction of an example leadless packaged semiconductor device 300 having a wettable flank lead design provided by a recess 310 at the bottom corner region of leads $325_1$ and $325_2$. The carrier for the leadframes can be a leadless carrier such as a Small Outline No-Lead (SON), Dual Flat No-Lead (DFN) or QFN carrier. Such leadless carriers form chip scale packages, which are characterized in that the leads thereof do not extend out from the package sides, thus reducing the overall package size.

With reference to FIG. 5, the packaged semiconductor device 300 includes a leadless leadframe including a die pad 315, a semiconductor chip 320 attached to the die pad 315 by die attach material 330. The leadframe includes a plurality of leads shown as $325_1$ and $325_2$ that extend about the die pad 315, each of the leads defining an opposing top surface 326 and a bottom surface 327 having an inner end 328, an outer end 329, and side surfaces (not shown). The bottom surface 327 and outer end 329 collectively define a bottom corner region. Recess 310 originates in the bottom corner region where the bottom surface 327 and outer end 329 would intersect.

Bond wires 340, which are electrically conductive, connect to and extend between a bond pad 320a on the semiconductor chip 320 and respective leads $325_1$ and $325_2$. The semiconductor chip 320 can comprise two or more stacked die. A mold compound 120 having sidewalls 120a is around the die pad 315, the leads $325_1$ and $325_2$, the semiconductor chip 320, and the bond wires 340 such that the bottom surface 327 and outer end 329 as well as the sidewalls 120a of the mold compound 120 are exposed. The die pad 315 is shown exposed from the mold compound 120 to provide an exposed thermal pad for the packaged semiconductor device 300.

The sidewalls 120a include at least one of (i) a first tone for its bottom portion $120a_1$ compared to a second tone different from the first tone for its top portion $120a_2$, and (ii) where the bottom portion $120a_1$ of the mold sidewall extends out beyond the top portion $120a_2$ of the mold sidewall, with both features (i) and (ii) being shown in FIG. 5. The first tone of the bottom portion $120a_1$ of the mold sidewall differentiated from the tone of the top portion $120a_2$ of the mold sidewall is due to the selective exposure of the bottom portion $120a_1$ to the de-flash process after first cut (and no de-flash exposure to the top portion $120a_2$). The tone difference can be observed using visible light viewing or a visible light inspection. In addition, as described above, wherein the second sawing provides a wider cut (e.g., by at least 0.05 mm) as compared to the partial cuts 115 provided by the first partial sawing, this results in the bottom portion of the package sidewall extending beyond the top sidewall which is yet another unique fingerprint for disclosed packaged semiconductor devices.

The foregoing nozzle 128, as shown herein, offers advantages which include: the absence of Cu burr protrusion which might otherwise occur due to inward push motion, simplification of the underlying singulation process and waterjet mechanism due to linear motion of dispelled particles along a prior cut line; a partial cut which serves as an alignment mark; and potentially lower water pressure operational requirements for water injectors as compared with other methods.

The foregoing has been described herein using specific examples for the purposes of illustration only. It will be readily apparent to one of ordinary skill in the art, however, that the principles of the disclosure can be embodied in other ways. Therefore, the foregoing should not be regarded as being limited in scope to the specific examples disclosed herein, but instead as being fully commensurate in scope with the following claims.

I claim:

1. A method of forming a packaged semiconductor device, comprising:
conducting a partial sawing of a plurality of leads on a bottom side of a semiconductor package having a top side opposite said bottom side, the semiconductor package comprising a leadframe including a die pad, a semiconductor chip attached to said die pad, the plurality of leads extending about said die pad, each defining an opposing top and bottom surface and having an inner end, and an outer end, wherein said bottom surface and said outer end collectively define a bottom corner region, at least one conductive bond wire electrically connected to and extending between a bond pad on the semiconductor chip and a respective one of the leads from the plurality of leads, a mold compound around the die pad, the plurality of leads, the semiconductor chip, and the at least one conductive bond wire such that the bottom surface and the outer end are exposed, the partial sawing severing the plurality of leads and forming a partial cut in said mold compound;
performing a de-flash process using a pulsed waterjet, applied to the bottom side using a waterjet nozzle, the waterjet nozzle comprising: a central core having a conically shaped passage between a nozzle inlet, lying in a first plane, and a nozzle outlet lying in a second plane; an end, lying partial in a third plane, including a groove, above the third plane, along a first line in the third plane, the end further including a flange, lying below the third plane, along a second line on the third plane, intersecting the first line; and
a tube connecting the nozzle outlet to the groove,
wherein performing the de-flash process includes positioning the flange of the waterjet nozzle within the partial cut to increase flow resistance along the partial cut and direct flow from the waterjet within the groove;
aligning a saw blade for a second sawing, over the partial cut, from the top side; and performing a second sawing reaching said partial cut to singulate the semiconductor package, wherein the second sawing does not touch the plurality of leads.

2. The method of forming a packaged semiconductor device as recited in claim 1 wherein the pulsed waterjet is applied, using varying amounts of pressure, to the bottom side.

3. The method of forming a packaged semiconductor device as recited in claim 2 wherein the varying amounts of pressure includes increasing the pressure applied to the waterjet.

4. The method of forming a packaged semiconductor device as recited in claim 2 wherein the varying amounts of pressure includes decreasing the pressure applied to the waterjet.

5. The method of forming a packaged semiconductor device, as recited in claim 1, wherein the packaged semiconductor device is a leadless package device.

6. The method of forming a packaged semiconductor device, as recited in claim 5, wherein the leadless package device is a Quad Flat No-Lead (QFN) package.

7. The method of forming a packaged semiconductor device as recited in claim 5, wherein the leadless package device is a Small Outline No-Lead (SON) package.

8. The method of forming a packaged semiconductor device as recited in claim 1, wherein performing the de-flash process includes positioning the waterjet nozzle such that the third plane of the waterjet nozzle registers with the bottom side of the semiconductor package with the flange within the groove.

9. A method of forming a plurality of packaged semiconductor devices, comprising:
   partial sawing a plurality of leads of a leadframe strip for the plurality of packaged semiconductor devices, on a bottom side of the leadframe strip having a top side opposite said bottom side, the leadframe strip comprising the plurality of leads, a semiconductor chip for each of the plurality of packaged semiconductor devices, and a common mold compound around the plurality of leads and the semiconductor chip for each of the plurality of packaged semiconductor devices, the partial sawing severing the plurality of leads and forming a partial cut in the mold compound;
   positioning a nozzle adjacent to the partial cut, the nozzle comprising:
      a nozzle inlet fluidly connected to a fluid source;
      a central core downstream of the nozzle inlet;
      a nozzle outlet downstream of the central core;
      a groove extending laterally from the nozzle outlet; and
      a flange extending beyond an end of the nozzle outlet, wherein positioning the nozzle adjacent to the partial cut includes fitting the flange within the partial cut; and
   performing a de-flash process to the severed plurality of leads using a pulsed jet applied to the bottom side at the partial cut with the nozzle, wherein the flange increases flow resistance along the partial cut to direct fluid flow within the groove.

10. The method of claim 9, further comprising:
   aligning a saw blade for a second sawing, over the partial cut, from the top side; and
   performing a second sawing reaching said partial cut to singulate the plurality of packaged semiconductor devices, wherein the second sawing does not touch the plurality of leads.

11. The method of claim 9, wherein the pulsed jet is applied using varying amounts of pressure, to the bottom side.

12. The method of claim 9, wherein each of the plurality of packaged semiconductor devices is a leadless package device.

13. The method of claim 12, wherein the leadless package device is a Quad Flat No-Lead (QFN) package.

14. The method of claim 12, wherein the leadless package device is a Small Outline No-Lead (SON) package.

15. The method of claim 9, wherein performing the de-flash process includes positioning the nozzle such that a bottom of the nozzle registers with the bottom side of the leadframe strip with the flange within the groove.

* * * * *